United States Patent [19]
Dorri et al.

[11] Patent Number: 5,721,523
[45] Date of Patent: Feb. 24, 1998

[54] COMPACT MRI SUPERCONDUCTING MAGNET

[75] Inventors: Bizhan Dorri, Clifton Park; Evangelos Trifon Laskaris, Schenectady; Michele Dollar Ogle, Burnt Hills, all of N.Y.

[73] Assignee: General Electric Company, Schenectady, N.Y.

[21] Appl. No.: 697,515

[22] Filed: Aug. 26, 1996

[51] Int. Cl.$^6$ .............................. H01F 1/00; G01N 27/72
[52] U.S. Cl. .......................... 335/216; 335/299; 324/319
[58] Field of Search .................................. 335/216, 296, 335/299, 301, 306; 324/318, 319, 320; 505/844, 879

[56] References Cited

U.S. PATENT DOCUMENTS

| | | |
|---|---|---|
| 4,698,611 | 10/1987 | Vermilyea . |
| 4,701,736 | 10/1987 | McDougall et al. . |
| 4,710,741 | 12/1987 | McGinley . |
| 4,724,412 | 2/1988 | Kalafala . |
| 4,771,243 | 9/1988 | Vreugdenhil et al. . |
| 4,890,082 | 12/1989 | Fujita . |
| 5,001,447 | 3/1991 | Jayakumar . |
| 5,023,584 | 6/1991 | Laskaris ..................... 335/216 |
| 5,291,169 | 3/1994 | Ige et al. . |
| 5,296,812 | 3/1994 | Kitamura et al. ............ 324/319 |
| 5,309,106 | 5/1994 | Mayajima et al. . |
| 5,343,182 | 8/1994 | Ohta ........................... 335/299 |
| 5,396,208 | 3/1995 | Dorri et al. . |
| 5,410,287 | 4/1995 | Laskaris et al. . |
| 5,428,292 | 6/1995 | Dorri et al. . |
| 5,463,364 | 10/1995 | Muller . |
| 5,485,088 | 1/1996 | Westphal et al. . |
| 5,519,372 | 5/1996 | Palkovich ................... 335/216 |
| 5,565,831 | 10/1996 | Dorri et al. ................. 335/216 |
| 5,568,102 | 10/1996 | Dorri et al. ................. 335/216 |
| 5,568,110 | 10/1996 | Dorri et al. ................. 335/216 |
| 5,594,401 | 1/1997 | Dorri et al. ................. 335/216 |

OTHER PUBLICATIONS

Concurrently filed U.S. Patent Application RD–25148, by Dorri et al., entitled "Closed MRI Magnet Having Compact Design", Serial No. 08/697,516.

*Primary Examiner*—Matthew V. Nguyen
*Attorney, Agent, or Firm*—Douglas E. Erickson; Marvin Snyder

[57] ABSTRACT

A closed magnetic resonance imaging (MRI) magnet has a single superconductive coil assembly including a coil housing containing a cryogenic fluid dewar containing a pair of longitudinally-outermost impregnated superconductive main coils and at-least-one cryostable additional superconductive coil such as a pair of additional main coils, a pair of bucking coils, and/or a pair of shielding coils. An open MRI magnet has two spaced-apart superconductive coil assemblies and an imaging volume having a center. Each coil assembly has a cryostable superconductive main coil and an impregnated bucking coil with the impregnated bucking coil being the closest superconductive coil to the center of the imaging volume.

16 Claims, 2 Drawing Sheets

COMPACT MRI SUPERCONDUCTING MAGNET

BACKGROUND OF THE INVENTION

The present invention relates generally to an open or closed superconductive magnet (such as, but not limited to, a helium-cooled and/or cryocooler-cooled superconductive magnet) used to generate a high magnetic field as part of a magnetic resonance imaging (MRI) system, and more particularly to such a magnet having a compact design and having a homogeneous (i.e., uniform) magnetic field within its imaging volume.

MRI systems employing superconductive or other type magnets are used in various fields such as medical diagnostics. Known superconductive magnets include liquid-helium cooled and cryocooler-cooled superconductive magnets. Typically, for a helium-cooled magnet, the superconductive coil assembly includes a superconductive main coil which is at least partially immersed in liquid helium contained in a helium dewar which is surrounded by a dual thermal shield which is surrounded by a vacuum enclosure. In a conventional cryocooler-cooled magnet, the superconductive main coil is surrounded by a thermal shield which is surrounded by a vacuum enclosure, and the cryocooler coldhead is externally mounted to the vacuum enclosure with the coldhead's first stage in thermal contact with the thermal shield and with the coldhead's second stage in thermal contact with the superconductive main coil. Nb—Ti superconductive coils typically operate at a temperature of generally 4 Kelvin, and Nb—Sn superconductive coils typically operate at a temperature of generally 10 Kelvin.

In some liquid-helium cooled superconductive magnets, the superconductive coils are of the cryostable (i.e., non-impregnated) type having superconductive windings generally completely contacted by the liquid helium typically through porous spiral-wound electrical insulation. Such cryostable coils must be wound on coil forms for support. In other liquid-helium cooled superconductive magnets, the superconductive coils are of the (e.g., epoxy) impregnated type having superconductive windings cooled by internal thermal conduction through the epoxy as well as along the length of the superconductor. Such impregnated coils are self supporting and do not require coil forms for support.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a spherical imaging volume centered within the magnet's bore where the object to be imaged is placed.

Although the magnet is so designed to have a highly uniform magnetic field within the imaging volume, manufacturing tolerances in the magnet and magnetic field disturbances caused by the environment at the field site of the magnet usually require that the magnet be corrected at the field site for such minor irregularities in the magnetic field. Typically, the magnet is shimmed at the field site by using pieces of iron, or, for Nb—Ti superconductive magnets cooled by liquid helium, by using numerous Nb—Ti superconductive correction coils. The correction coils are placed within the superconductive coil assembly radially near and radially inward of the main coils. Each correction coil carries a different, but low, electric current in any required direction including a direction opposite to the direction of the electric current carried in the main coils. It is also known to shim a closed magnet by using numerous resistive DC shim coils all located outside the vacuum enclosure (i.e., coil housing) in the bore. The resistive DC shim coils each produce time-constant magnetic fields and may include a single shim coil coaxially aligned with the longitudinal axis and carrying an electric current in a direction opposite to the current direction of the superconductive main coils to correct a harmonic of symmetrical inhomogeneity in the magnetic field within the imaging volume caused by manufacturing tolerances and/or site disturbances. It is noted that time-varying-magnetic-field gradient coils typically are placed in the magnet's bore for MRI imaging.

Closed MRI magnets tend to have a relatively long axial (i.e., longitudinal) length to accommodate the number of main superconductive coils needed to achieve a homogeneous imaging volume which, especially in the case of whole-body magnets, tends to create claustrophobic feelings in patients.

Open magnets typically employ two spaced-apart superconductive coil assemblies with the open space between the assemblies allowing for access by medical personnel for surgery or other medical procedures during MRI imaging. The patient may be positioned in that space or also in the bore of the toroidal-shaped coil assemblies. The open space helps the patient overcome any feelings of claustrophobia that may be experienced in a closed magnet design. Open magnets are known which use superconductive bucking coils radially inward from the superconductive main coils to correct for gross distortions in the magnetic field within the imaging volume created by having the open space between the superconductive coil assemblies. Such bucking coils have electric currents with generally the same amperage but the opposite direction to the electric current carried by the main coils. It is noted the open magnets are more expensive than closed magnets for the same strength magnetic field within the imaging volume.

What is needed is a closed MRI magnet with its single superconductive coil assembly having a relatively short axial (i.e., longitudinal) length and an open MRI magnet having a large axial gap between its two superconductive coil assemblies to overcome claustrophobic feelings of patients and to provide greater patient access by physicians, with such closed and open magnets also designed to have a highly uniform magnetic field within its imaging volume to provide for sharp medical images.

SUMMARY OF THE INVENTION

It is an object of the invention to provide a superconductive MRI magnet.

In a first embodiment, the closed MRI magnet of the invention has a single superconductive coil assembly including a generally toroidal-shaped coil housing surrounding a bore and having a generally longitudinally-extending axis. The single superconductive coil assembly additionally includes a dewar disposed within the coil housing and containing a cryogenic fluid. The single superconductive coil assembly also includes a pair of spaced-apart, longitudinally-outermost, generally identical, and generally annular-shaped superconductive main coils and at-least-one additional superconductive coil each generally coaxially aligned with the axis and located within the dewar. The at-least-one additional superconductive coil is a cryostable superconductive coil having a superconductor with an outer surface generally completely contacted by the cryogenic fluid, and the pair of superconductive main coils is a pair of impregnated superconductive coils having a superconductor with an outer surface covered by an impregnation such that generally only the impregnation is contacted by the cryogenic fluid.

In a second embodiment, the open MRI magnet of the invention has a first superconductive coil assembly including a first coil housing, a first dewar located within the first coil housing, and first superconductive main and bucking coils located within the first dewar and carrying electric current in opposite directions. The first superconductive bucking coil is a first impregnated superconductive coil, and the first superconductive main coil is a first cryostable superconductive coil. The magnet also includes a second superconductive coil assembly including a second coil housing longitudinally spaced apart from the first coil housing, a second dewar located within the second coil housing, and second superconductive main and bucking coils located within the second dewar and carrying electric current in opposite directions. The second superconductive bucking coil is a second impregnated superconductive coil, and the second superconductive main coil is a second cryostable superconductive coil. The magnet further includes an imaging volume located longitudinally between and radially inward from the first and second coil housings. The first superconductive bucking coil is the closest superconductive coil within the first coil housing to the center of the imaging volume, and the second superconductive bucking coil is the closest superconductive coil within the second coil housing to the center of the imaging volume.

Several benefits and advantages are derived from the invention. A superconductive coil typically includes a copper stabilizer. A cryostable (i.e., non-impregnated) superconductive coil is less prone to quenching (i.e., loss of superconductivity due to high temperature) than an impregnated coil. However, to avoid quenching, the non-impregnated coil requires at least two times as much copper as an impregnated coil, the extra copper being needed to carry away the extra heat generated by the electromagnetic motion of the non-impregnated coil. With Applicant's closed MRI magnet design, only the longitudinally-outermost superconductive main coils need to be impregnated coils which shortens the overall axial (i.e., longitudinal) length of the closed magnet because no coil form is needed to support the impregnated coils and because less copper is needed in an impregnated coil than in a cryostable coil, while at least one (and preferably the rest) of the other superconductive coils may be cryostable coils which offer better resistance to quenching. With Applicant's open MRI magnet design, only the longitudinally innermost bucking coil in each coil assembly needs to be an impregnated coil which shortens the longitudinally inward dimension of each coil assembly (because no coil form and less copper is needed) which increases the axial gap between the two coil assemblies, while a main superconductive coil (and preferably all the other superconductive coils) in each of the coil assemblies may be cryostable coils which offer better resistance to quenching.

BRIEF DESCRIPTION OF THE DRAWINGS

The accompanying drawings illustrate two preferred embodiments of the present invention wherein.

DETAILED DESCRIPTION OF THE INVENTION

Figure 1:
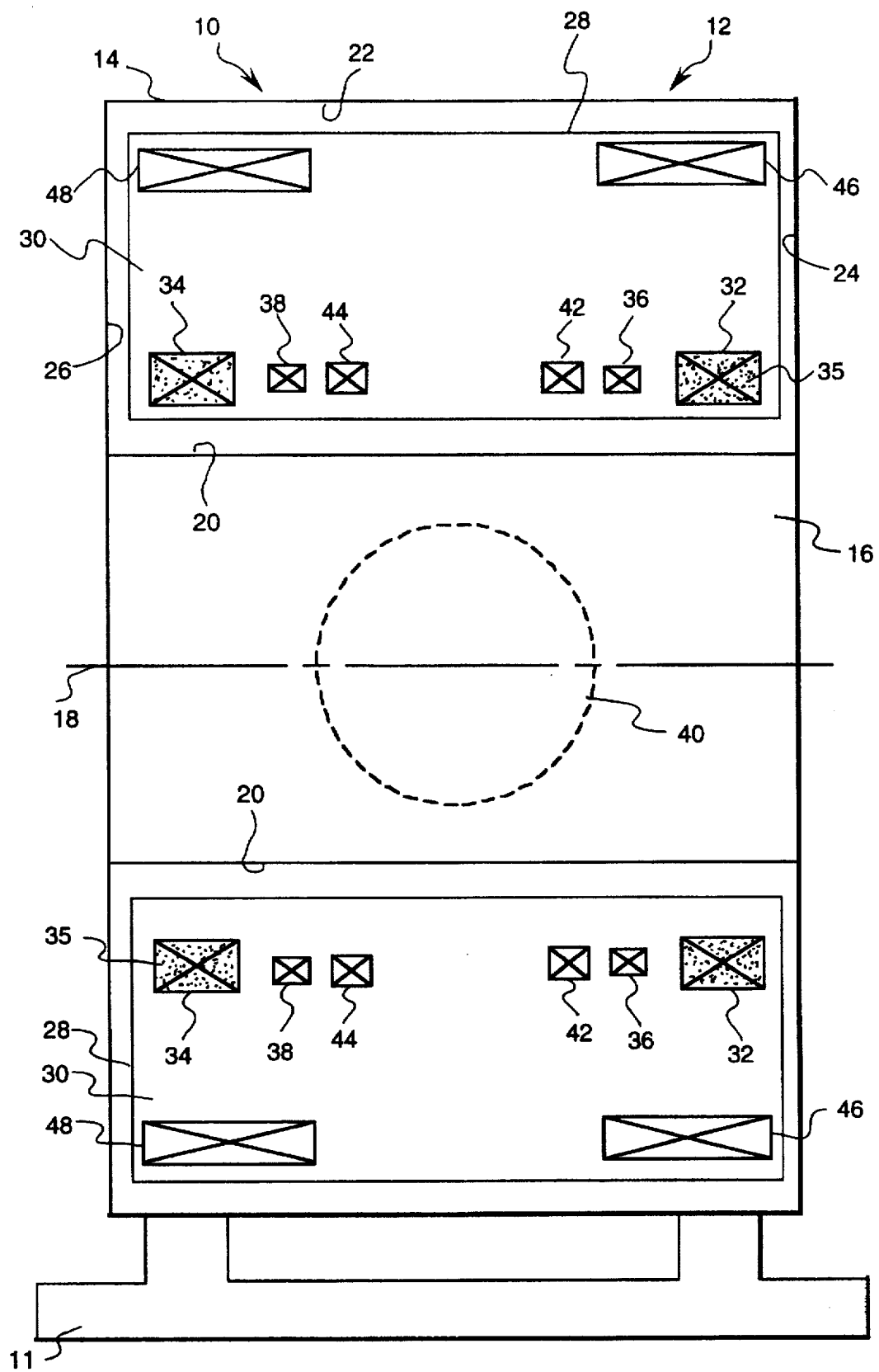
FIG. 1 is a schematic cross-sectional side-elevational view of a preferred closed-magnet-type embodiment of the MRI magnet of the invention.

Referring now to the drawings, FIG. 1 shows a first preferred embodiment of the present invention. A closed magnetic-resonance-imaging (MRI) magnet 10, supported by a floor mount 11, is shown having a single superconductive coil assembly 12. The single superconductive coil assembly 12 includes a generally toroidal-shaped coil housing 14 surrounding a bore 16 and having a generally longitudinally-extending axis 18. The coil housing 14 includes spaced-apart and generally-cylindrical-shaped, radially inner and radially-outer outside walls 20 and 22. The coil housing 14 also includes spaced-apart longitudinally-outermost end walls 24 and 26. Each of the longitudinally-outermost end walls 24 and 26 preferably is a generally-annular outside surface. Typically, the coil housing 14 defines a vacuum enclosure.

The single superconductive coil assembly 12 further includes a dewar 28 disposed within the coil housing 14 and containing a cryogenic fluid 30. A preferred choice of cryogenic fluid 30 is liquid helium. One or more thermal shields may be placed between, and spaced apart from, the dewar 28 and the coil housing 14, such thermal shield(s) and spacers being omitted from the figures for clarity.

The single superconductive coil assembly 12 also includes a pair of spaced-apart, longitudinally-outermost, generally identical, and generally annular-shaped superconductive main coils 32 and 34 each generally coaxially aligned with the axis 18 and disposed within the dewar 28. The pair of superconductive main coils 32 and 34 is a pair of impregnated superconductive coils having a superconductor with an outer surface covered (whether directly or indirectly) by an impregnation 35 (indicated in FIG. 1 by the speckled surface on 32 and 34) such that generally only the impregnation 35 (and not the underlying outer surface) is contacted by the cryogenic fluid 30. Preferably, the superconductive main coils 32 and 34 are the only impregnated superconductive coils within the dewar 28 and the coil housing 14, are epoxy-impregnated superconductive coils, and are each radially disposed more towards the radially-inner outside wall 20 than the radially-outer outside wall 22. The impregnated superconductive main coils 32 and 34 may be self-supporting and spaced-apart from the dewar 28 by spacers, directly supported on a coil form, or preferably directly supported by proximate dewar walls, such spacers and direct support being omitted from the figures for clarity. In one preferred construction, the impregnated superconductive main coils 32 and 34 each have a copper-to-superconductor ratio of generally between one and two.

It is noted that the pair of superconductive main coils 32 and 34 each is a DC (direct current) coil carrying a generally time-constant and generally identical electric current in an identical first electric current direction. The first electric-current direction is defined to be either a clockwise or a counterclockwise circumferential direction about the axis 18 with any slight longitudinal component of current direction being ignored. Hence, each of the pair of superconductive main coils 32 and 34 produce generally time-constant and generally identical magnetic fields which have a generally identical first magnetic-field direction within the bore 16 which is generally parallel to the axis 18.

The superconductor used in each of the superconductive main coils 32 and 34 typically would be a superconductive wire or superconductive tape wound such that each superconductive main coil 32 and 34 has a longitudinal extension and a radial extension (i.e., radial thickness) far greater than the corresponding dimensions of the superconductive wire or superconductive tape.

The single superconductive coil assembly 12 additionally includes at-least-one additional superconductive coil 36, 38, 42, 44, 46, and 48 generally coaxially aligned with the axis 18 and disposed within the dewar 28, wherein the at-least-one additional superconductive coil 36, 38, 42, 44, 46, and 48 is a cryostable (i.e., non-impregnated) superconductive coil having a superconductor with an outer surface generally completely contacted (whether through surrounding porous electrical insulation or through gaps in the porous electrical insulation) by the cryogenic fluid 30. The at-least-one additional superconductive coil 36, 38, 42, 44, 46, and 48 is a DC coil carrying a generally time-constant electric current preferably generally equal in amperage to the current carried by the superconductive main coils 32 and 34. Preferably, the cryostable at-least-one additional superconductive coil 36, 38, 42, 44, 46, and 48 has a copper-to-superconductor ratio of at least generally five.

In a preferred embodiment, the at-least-one additional superconductive coil 36, 38, 42, 44, 46, and 48 includes a pair of longitudinally spaced-apart, generally identical, and generally annular-shaped, superconductive bucking coils 36, and 38 each carrying a generally identical electric current in an opposite direction to the first electric-current direction and each disposed longitudinally inward of the pair of superconductive main coils 32 and 34. The superconductive bucking coils 36 and 38 help maintain a homogeneous imaging volume 40 when longitudinally outer superconductive main coils are moved axially inward to shorten the axial length of the closed magnet 10. A shorter axial length reduces claustrophobic feeling in patients and provides the physicians with greater access to the patient. The pair of superconductive bucking coils 36 and 38 are each radially disposed more towards the radially-inner outside wall 20 than the radially-outer outside wall 22.

Typically, the at-least-one superconductive coil 36, 38, 42, 44, 46, and 48 includes a pair of longitudinally spaced-apart, generally identical, and generally annular-shaped additional superconductive main coils 42 and 44 each carrying an electric current equal in amperage and direction to the electric current carried in the pair of superconductive main coils 32 and 34 and each disposed longitudinally inward of the pair of superconductive bucking coils 36 and 38. The additional superconductive main coils 42 and 44 (and others, omitted for clarity) usually are needed to achieve a high magnetic field strength, within the magnet's imaging volume 40, without exceeding the critical current density of the superconductor being used in the coils, as is known to those skilled in the art. The need for a single one, a single pair, or more additional superconductive main coils may be determined by the artisan for a particular magnet design. The pair of additional superconductive main coils 42 and 44 are each radially disposed more towards the radially-inner outside wall 20 than the radially-outer outside wall 22.

In an exemplary embodiment, the at-least-one additional superconductive coil 36, 38, 42, 44, 46, and 48 includes a pair of longitudinally spaced-apart, generally identical, and generally annular-shaped, superconductive shielding coils 46, and 48 each carrying a generally identical electric current in the opposite direction to the first electric-current direction and each disposed radially outward of the pair of superconductive main coils 32 and 34. The superconductive shielding coils 46 and 48 help contain any stray magnetic field originating from the superconductive main coils 32 and 34 and the additional superconductive main coils 42 and 44. Such shielding makes the closed magnet 10 easier to site in a hospital room containing electronic equipment whose proper operation would be compromised by the magnet's stray field, as can be appreciated by those skilled in the art. The pair of superconductive shielding coils 46 and 48 are each radially disposed more towards the radially-outer outside wall 22 than the radially-inner outside wall 20.

Applicant's estimate that a 1.5 Tesla closed magnet can have its axial (i.e., longitudinal) length shortened from generally 67 inches to generally 55 inches by having the pair of superconductive main coils 32 and 34 be the only impregnated coils in the dewar 28 and the coil housing 14. It is noted that the dewar 28 may be a single unit (as shown in FIG. 1) containing all of the superconductive coils 32, 34, 36, 38, 42, 44, 46, and 48, or the dewar 28 may include two or more sub-dewars (not shown in FIG. 1) each containing only some of such superconductive coils. It is noted that, for the single superconductive coil assembly 12, the sum of the magnetic fields at the center of the imaging volume 40 from all of the superconductive bucking coils 36 and 38 is always less than generally twenty percent of the sum of the magnetic fields at the center of the imaging volume 40 from all of the superconductive main and additional superconductive main coils 32, 34, 42, and 44. It is also noted that, for the single superconductive coil assembly 12, the sum of the magnetic fields at the center of the imaging volume 40 from all of the superconductive shielding coils 46 and 48 is always less than generally fifty percent of the sum of the magnetic fields at the center of the imaging volume 40 from all of the superconductive main and additional superconductive main coils 32, 34, 42, and 44.

Figure 2:
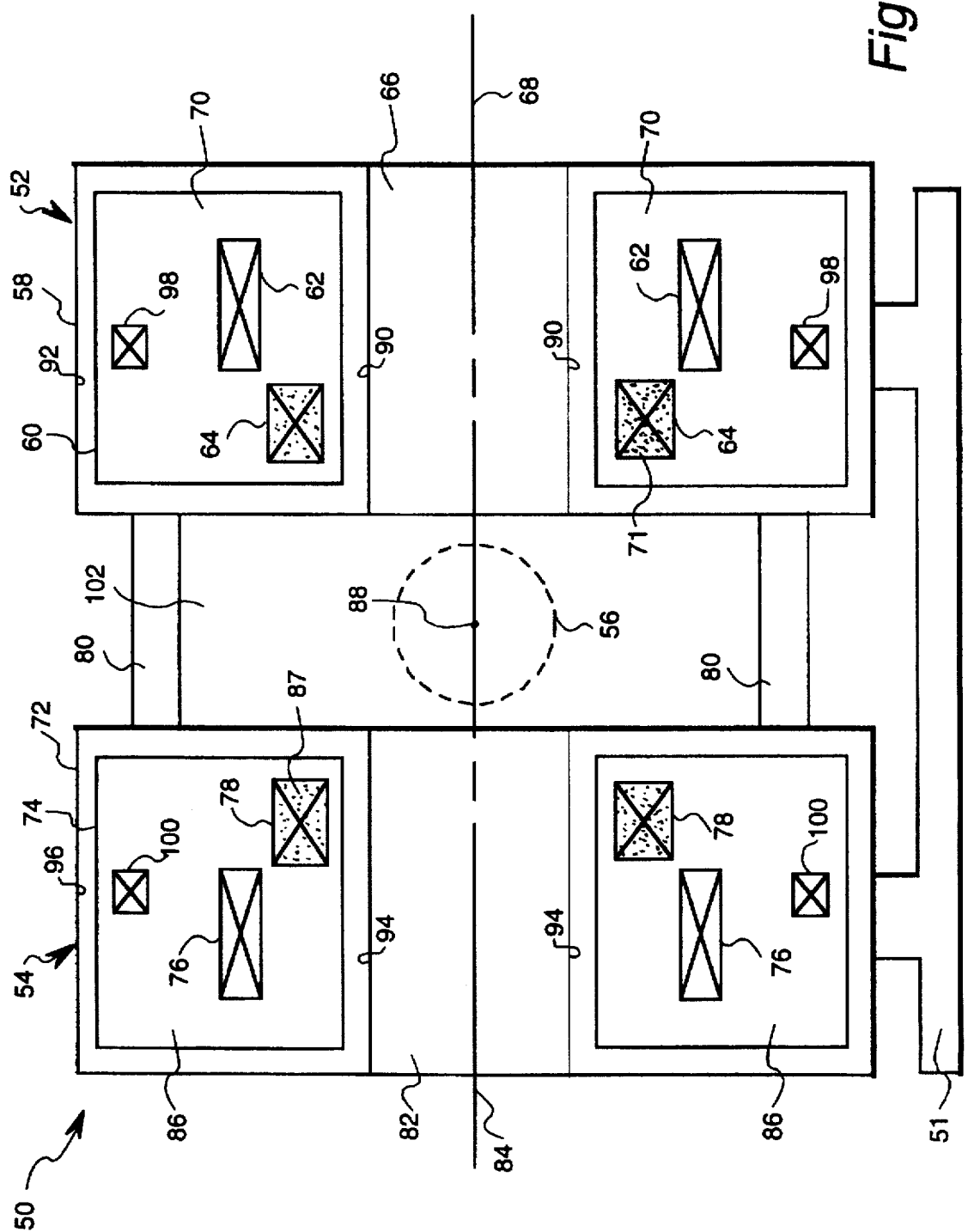
FIG. 2 is a schematic cross-sectional side-elevational view of a preferred open-magnet-type embodiment of the MRI magnet of the invention.

Referring again to the drawings, FIG. 2 shows a second preferred embodiment of the present invention. An open magnetic-resonance-imaging (MRI) magnet 50, supported by a floor mount 51, is shown having a first superconductive coil assembly 52, a second superconductive coil assembly 54, and an imaging volume 56. The first superconductive coil assembly 52 includes a generally toroidal-shaped first coil housing 58, a first dewar 60, a generally annular-shaped first superconductive main coil 62, and a generally annular-shaped first superconductive bucking coil 64. The first coil housing 58 surrounds a first bore 66 and has a generally longitudinally-extending first axis 68. The first dewar 60 is disposed within the first coil housing 58 and contains a first cryogenic fluid 70. The first superconductive main coil 62 is generally coaxially aligned with the first axis 68, disposed within the first dewar 60, and carries a first main electric current in a first electric current direction. The first superconductive bucking coil 64 is generally coaxially aligned with the first axis 68, disposed within the first dewar 60, and carries a first bucking electric current in an opposite direction to the first electric current direction. The first superconductive main coil 62 is a first cryostable superconductive coil having a superconductor with an outer surface generally completely contacted (whether through surrounding porous electrical insulation or through gaps in the porous electrical insulation) by the first cryogenic fluid 70, and the first superconductive bucking coil 64 is a first impregnated superconductive coil having a superconductor with an outer surface covered (whether directly or indirectly) by a first impregnation 71 (indicated in FIG. 2 by the speckled surface on 64) such that generally only the first impregnation 71 (and not the underlying outer surface) is contacted by the first cryogenic fluid 70. Preferably, the first superconductive bucking coil 64 is the only impregnated superconductive coil within the first dewar 60 and the first coil housing 58.

The second superconductive coil assembly 54 includes a generally toroidal-shaped second coil housing 72, a second dewar 74, a generally annular-shaped second superconductive main coil 76, and a generally annular-shaped second superconductive bucking coil 78. The second coil housing 72 is longitudinally spaced apart from the first coil housing 58 (such as by structural posts 80), surrounds a second bore 82 and has a generally longitudinally-extending second axis 84 generally coaxially-aligned with the first axis 68. The second dewar 74 is disposed within the second coil housing 72 and contains a second cryogenic fluid 86. It is noted that the second dewar 74 may be fluidly independent of the first dewar 60, or the second dewar 74 may be in fluid communication with the first dewar 60 through one or more of the structural posts 80. The second superconductive main coil 76 is generally coaxially aligned with the second axis 84, disposed within the second dewar 74, and carries a second main electric current in the first electric current direction. The second superconductive bucking coil 78 is generally coaxially aligned with the second axis 84, disposed within the second dewar 74, and carries a second bucking electric current in the opposite direction to the first electric current direction. The second superconductive main coil 76 is a second cryostable superconductive coil having a superconductor with an outer surface generally completely contacted (whether through surrounding porous electrical insulation or through gaps in the porous electrical insulation) by the second cryogenic fluid 86, and the second superconductive bucking coil 78 is a second impregnated superconductive coil having a superconductor with an outer surface covered (whether directly or indirectly) by a second impregnation 87 (indicated in FIG. 2 by the speckled surface on 78) such that generally only the second impregnation 87 (and not the underlying outer surface) is contacted by the second cryogenic fluid 86. Preferably, the second superconductive bucking coil 78 is the only impregnated superconductive coil within the second dewar 74 and the second coil housing 72.

The imaging volume 56 has a center 88 and a magnetic field at least partially produced by the first and second superconductive main coils 62 and 76 and by the first and second superconductive bucking coils 64 and 78. The imaging volume 56 is disposed longitudinally between and radially inward from the first and second coil housings 58 and 72. The first superconductive bucking coil 64 is the closest superconductive coil within the first coil housing 58 to the center 88 of the imaging volume 56, and the second superconductive bucking coil 78 is the closest superconductive coil within the second coil housing 72 to the center 88 of the imaging volume 56.

In a preferred embodiment, the first coil housing 58 has spaced-apart and generally-cylindrically-shaped, first radially-inner and radially-outer outside walls 90 and 92, wherein the first superconductive main coil 62 and the first superconductive bucking coil 64 are radially disposed more towards the first radially-inner outside wall 90 than the first radially-outer outside wall 92. Likewise, the second coil housing 72 has spaced-apart and generally-cylindrical-shaped, second radially-inner and radially-outer outside walls 94 and 96, wherein the second superconductive main coil 76 and the second superconductive bucking coil 78 are radially disposed more towards the second radially-inner outside wall 94 than the second radially-outer outside wall 96.

In an exemplary embodiment, the first superconductive coil assembly 52 also includes a first superconductive shielding coil 98 disposed within the first dewar 60 radially outward of the first superconductive main coil 62 and the first superconductive bucking coil 64 and carrying an electric current in the opposite direction to the first electric current direction. Likewise, the second superconductive coil assembly 54 also includes a second superconductive shielding coil 100 disposed within the second dewar 74 radially outward of the second superconductive main coil 76 and the second superconductive bucking coil 78 and carrying an electric current in the opposite direction to the first electric current direction. The first superconductive shielding coil 98 is radially disposed more towards the first radially-outer outside wall 92 than the first radially-inner outside wall 90, and the second superconductive shielding coil 100 is radially disposed more towards the second radially-outer outside wall 96 than the second radially-inner outside wall 94.

In an exemplary construction, the first and second impregnated superconductive coils (i.e., the first and second superconductive bucking coils 64 and 78) each have a copper-to-superconductor ratio of generally between one and two. The first and second cryostable superconductive coils (i.e., the first and second superconductive main coils 62 and 76) each have a copper-to-superconductor ratio of at least generally seven. Preferably, the first and second impregnated superconductive coils (i.e., the first and second superconductive bucking coils 64 and 78) each are epoxy-impregnated superconductive coils.

Applicant's estimate that a 0.5 Tesla open magnet can have its inter-coil-assembly axial (i.e., longitudinal) gap 102 be widened from generally 22 inches to generally 24 inches by having the first superconductive bucking coil 64 be the only impregnated coil in the first dewar 60 and the first coil housing 58 and by having the second superconductive bucking coil 78 be the only impregnated coil in the second dewar 74 and the second coil housing 72.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. A closed magnetic-resonance-imaging magnet comprising a single superconductive coil assembly including:

a) a generally toroidal-shaped coil housing surrounding a bore and having a generally longitudinally-extending axis;

b) a dewar disposed within said coil housing and containing a cryogenic fluid;

b) a pair of spaced-apart, longitudinally-outermost, generally identical, and generally annular-shaped superconductive main coils each generally coaxially aligned with said axis and disposed within said dewar; and c) at-least-one additional superconductive coil generally coaxially aligned with said axis and disposed within said dewar, wherein said at-least-one additional superconductive coil is a cryostable superconductive coil having a superconductor with an outer surface generally completely contacted by said cryogenic fluid, and wherein said pair of superconductive main coils is a pair of impregnated superconductive coils having a superconductor with an outer surface covered by an impregnation such that generally only said impregnation is contacted by said cryogenic fluid.

2. The magnet of claim 1, wherein said pair of superconductive main coils are the only impregnated superconductive coils within said dewar.

3. The magnet of claim 2, wherein said pair of superconductive main coils each carries a generally identical electric current in an identical first electric current direction, and wherein said at-least-one additional superconductive coil includes a pair of superconductive bucking coils each carrying a generally identical electric current in an opposite direction to said first electric-current direction and each disposed longitudinally inward of said pair of superconductive main coils.

4. The magnet of claim 3, wherein said at-least-one additional superconductive coil includes a pair of additional superconductive main coils each carrying a generally identical electric current in said first electric-current direction and each disposed longitudinally inward of said pair of superconductive bucking coils.

5. The magnet of claim 4, wherein said coil housing has spaced-apart and generally-cylindrical-shaped, radially-inner and radially-outer outside walls, and wherein said pair of superconductive main coils, said pair of superconductive bucking coils, and said pair of additional superconductive main coils each are radially disposed more towards said radially-inner outside wall than said radially-outer outside wall.

6. The magnet of claim 5, wherein said at-least-one additional superconductive coil includes a pair of superconductive shielding coils each carrying a generally identical electric current in said opposite direction and each disposed radially outward of said pair of superconductive main coils.

7. The magnet of claim 6, wherein said pair of superconductive shielding coils each are radially disposed more towards said radially-outer outside wall than said radially-inner outside wall.

8. The magnet of claim 1, wherein said impregnated superconductive coils each have a copper-to-superconductor ratio of generally between one and two, and wherein said cryostable superconductive coil has a copper-to-superconductor ratio of at least generally five.

9. The magnet of claim 8, wherein said impregnated superconductive coils are epoxy-impregnated superconductive coils.

10. An open magnetic-resonance-imaging magnet comprising:
 a) a first superconductive coil assembly including:
  (1) a generally toroidal-shaped first coil housing surrounding a first bore and having a generally longitudinally-extending first axis;
  (2) a first dewar disposed within said first coil housing and containing a first cryogenic fluid;
  (3) a generally annular-shaped first superconductive main coil generally coaxially aligned with said first axis, disposed within said first dewar, and carrying a first main electric current in a first electric current direction; and
  (4) a generally annular-shaped first superconductive bucking coil generally coaxially aligned with said first axis, disposed within said first dewar, and carrying a first bucking electric current in an opposite direction to said first electric current direction, wherein said first superconductive main coil is a first cryostable superconductive coil having a superconductor with an outer surface generally completely contacted by said first cryogenic fluid, and wherein said first superconductive bucking coil is a first impregnated superconductive coil having a superconductor with an outer surface covered by a first impregnation such that generally only said first impregnation is contacted by said first cryogenic fluid;
 b) a second superconductive coil assembly including:
  (1) a generally toroidal-shaped second coil housing longitudinally spaced apart from said first coil housing, surrounding a second bore, and having a generally longitudinally-extending second axis generally coaxially-aligned with said first axis;
  (2) a second dewar disposed within said second coil housing and containing a second cryogenic fluid;
  (3) a generally annular-shaped second superconductive main coil generally coaxially aligned with said second axis, disposed within said second dewar, and carrying a second main electric current in said first electric current direction; and
  (4) a generally annular-shaped second superconductive bucking coil generally coaxially aligned with said second axis, disposed within said second dewar, and carrying a second bucking electric current in said opposite direction, wherein said second superconductive main coil is a second cryostable superconductive coil having a superconductor with an outer surface generally completely contacted by said second cryogenic fluid, and wherein said second superconductive bucking coil is a second impregnated superconductive coil having a superconductor with an outer surface covered by a second impregnation such that generally only said second impregnation is contacted by second cryogenic fluid; and
 c) an imaging volume having a center and a magnetic field at least partially produced by said first and second superconductive main coils and by said first and second superconductive bucking coils, wherein said imaging volume is disposed longitudinally between and radially inward from said first and second coil housings, wherein said first superconductive bucking coil is the closest superconductive coil within said first coil housing to said center of said imaging volume, and wherein said second superconductive bucking coil is the closest superconductive coil within said second coil housing to said center of said imaging volume.

11. The magnet of claim 10, wherein said first superconductive bucking coil is the only impregnated superconductive coil within said first dewar, and wherein said second superconductive bucking coil is the only impregnated superconductive coil within said second dewar.

12. The magnet of claim 10, wherein said first coil housing has spaced-apart and generally-cylindrical-shaped, first radially-inner and radially-outer outside walls, wherein said first superconductive main coil and said first superconductive bucking coil are radially disposed more towards said first radially-inner outside wall than said first radially-outer outside wall, wherein said second coil housing has spaced-apart and generally-cylindrical-shaped, second radially-inner and radially-outer outside walls, and wherein said second superconductive main coil and said second superconductive bucking coil are radially disposed more towards said second radially-inner outside wall than said second radially-outer outside wall.

13. The magnet of claim 12, wherein said first superconductive coil assembly also includes a first superconductive shielding coil carrying an electric current in said opposite direction and disposed within said first dewar radially outward of said first superconductive main coil and said first superconductive bucking coil, and wherein said second superconductive coil assembly further includes a second superconductive shielding coil carrying an electric current in said opposite direction and disposed within said second dewar radially outward of said second superconductive main coil and said second superconductive bucking coil.

14. The magnet of claim 13, wherein said first superconductive shielding coil is radially disposed more towards said first radially-outer outside wall than said first radially-inner outside wall, and wherein said second superconductive shielding coil is radially disposed more towards said second radially-outer outside wall than said second radially-inner outside wall.

15. The magnet of claim 10, wherein said first and second impregnated superconductive coils each have a copper-to-superconductor ratio of generally between one and two, and wherein said first and second cryostable superconductive coils each have a copper-to-superconductor ratio of at least generally five.

16. The magnet of claim 15, wherein said first and second impregnated superconductive coils each are first and second epoxy-impregnated superconductive coils.

* * * * *